United States Patent
Kanai et al.

(10) Patent No.: US 7,849,746 B2
(45) Date of Patent: Dec. 14, 2010

(54) DRIVER DEVICE, PHYSICAL QUANTITY MEASURING DEVICE, AND ELECTRONIC INSTRUMENT

(75) Inventors: Masahiro Kanai, Suwa (JP); Naoki Yoshida, Suwa (JP); Eitaro Otsuka, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 313 days.

(21) Appl. No.: 11/984,977

(22) Filed: Nov. 26, 2007

(65) Prior Publication Data

US 2009/0078045 A1 Mar. 26, 2009

(30) Foreign Application Priority Data

Nov. 27, 2006 (JP) ............................. 2006-318761
Nov. 20, 2007 (JP) ............................. 2007-300255

(51) Int. Cl.
*G01N 29/036* (2006.01)
*H03L 1/00* (2006.01)
*G01H 13/00* (2006.01)
*G01P 1/04* (2006.01)

(52) U.S. Cl. ..................... 73/579; 73/866.1; 331/109; 331/154; 331/160

(58) Field of Classification Search ................. 73/579, 73/866.1; 331/109, 154, 160
See application file for complete search history.

(56) References Cited

U.S. PATENT DOCUMENTS

| 6,154,375 | A  | * | 11/2000 | Majid et al. ............... 363/16 |
| 7,002,330 | B2 | * | 2/2006 | Kitani et al. .............. 323/284 |
| 2004/0182184 | A1 |  | 9/2004 | Yokoi et al. |
| 2005/0052813 | A1 | * | 3/2005 | Kobayashi ................ 361/143 |
| 2006/0215427 | A1 | * | 9/2006 | Ma ............................ 363/50 |
| 2007/0290726 | A1 | * | 12/2007 | Kaiho et al. .............. 327/111 |
| 2008/0087084 | A1 | * | 4/2008 | Kanai et al. ............. 73/514.29 |
| 2008/0105054 | A1 | * | 5/2008 | Kanai et al. ............. 73/514.29 |
| 2008/0178672 | A1 | * | 7/2008 | Kanai et al. ............. 73/504.12 |
| 2009/0033432 | A1 | * | 2/2009 | Kanai et al. ............... 331/109 |
| 2009/0084180 | A1 | * | 4/2009 | Yoshida et al. .......... 73/504.02 |
| 2009/0133496 | A1 | * | 5/2009 | Kanai et al. ............. 73/504.12 |

FOREIGN PATENT DOCUMENTS

JP   A 2003-240556   8/2003
JP   A 2004-286503   10/2004

* cited by examiner

*Primary Examiner*—Daniel S Larkin
*Assistant Examiner*—Rose M Miller
(74) *Attorney, Agent, or Firm*—Oliff & Berridge, PLC

(57) ABSTRACT

A driver device that forms an oscillation loop with a vibrator and causes the vibrator to produce driving vibrations includes a current-voltage converter that is provided in the oscillation loop and converts a current that flows through the vibrator into a voltage, and a GCA as a comparator that is provided in the oscillation loop and outputs a signal corresponding to a comparison result between an output from the current-voltage converter and a given voltage. The GCA outputs a first high-level voltage or a low-level voltage during oscillation startup, and outputs a second high-level voltage or the low-level voltage in a steady oscillation state. The first high-level voltage is a voltage higher in potential than the second high-level voltage.

9 Claims, 8 Drawing Sheets

DRIVER DEVICE, PHYSICAL QUANTITY MEASURING DEVICE, AND ELECTRONIC INSTRUMENT

Japanese Patent Application No. 2006-318761 filed on Nov. 27, 2006 and Japanese Patent Application No. 2007-300255 filed on Nov. 20, 2007, are hereby incorporated by reference in their entirety.

BACKGROUND OF THE INVENTION

The present invention relates to a driver device which causes a vibrator to produce driving vibrations, a physical quantity measuring device (e.g. vibrating gyroscope) using the driver device, an electronic instrument, and the like.

Gyroscopes are classified as a rotating gyroscope, a vibrating gyroscope, and the like depending on the method of detecting the force applied to an object. In particular, a vibrating gyroscope is considered to be advantageous for reducing size and cost from the viewpoint of the constituent elements and the like. As a vibrating gyrosensor which detects an angular velocity applied to an object, a piezoelectric vibrating gyrosensor is known which excites a crystal or a piezoelectric element that is advantageous for increasing reliability and reducing size. A piezoelectric vibrating gyrosensor utilizes a phenomenon in which a Coriolis force occurs perpendicularly to vibrations when an angular velocity is applied to a vibrating object.

For example, a vibrating gyrosensor which detects an angular velocity causes a physical quantity transducer (vibrator) to produce driving vibrations in a specific direction. When an angular velocity is applied to the vibrator, a Coriolis force occurs perpendicularly to driving vibrations to produce detection vibrations. Since the detection vibrations occur perpendicularly to the driving vibrations, a detection signal (signal component due to detection vibrations) differs in phase from a drive signal (signal component due to driving vibrations) by 90 degrees. The detection signal can be synchronously detected separately from the drive signal utilizing the above phenomenon, for example.

A vibrating gyrosensor is used in a wide variety of applications, such as shake detection for a video camera or a digital camera, positioning using the global positioning system (GPS) for a car navigation system, and aircraft or robot position detection.

A vibrating gyrosensor used in these applications is driven by a battery. Therefore, it is necessary to increase the life of the battery by reducing the power consumption of the vibrating gyrosensor as much as possible. In this case, it is preferable to stop supplying power to the vibrating gyrosensor when an angular velocity or the like is not detected and to supply power to the vibrating gyrosensor from the battery only when using the vibrating gyrosensor. This makes it necessary to cause the vibrating gyrosensor to perform a normal operation within a short period of time after activation.

JP-A-2004-286503 and JP-A-2003-240556 disclose technologies for reducing the startup time of the vibrating gyrosensor, for example. JP-A-2004-286503 discloses technology in which a CR oscillation circuit or a ring oscillator is provided in an oscillation loop so that the oscillation amplitude is increased by an amplifier immediately after activation. JP-A-2003-240556 discloses technology in which a resistor is provided in series with a crystal vibrator to reduce the period of time until a signal from the vibrator becomes stable.

A vibrating gyrosensor driver device must cause a vibrator to constantly vibrate (oscillate) at its resonance frequency in order to stably detect the angular velocity applied to the vibrator. The driver device also must cause the vibrator to oscillate and start a normal operation within a short time. Moreover, it is preferable to form the driver device using a small circuit with low power consumption in order to increase the life of a battery at low cost.

On the other hand, when forming the vibrator using a crystal with a high Q value and hermetically sealing the vibrator in a package, the driving Q value of the vibrator increases to a large extent. Therefore, the period of time (startup time) until a signal from the vibrator becomes stable increases when causing the vibrator to produce driving vibrations.

However, according to the technology disclosed in JP-A-2004-286503, when causing the crystal vibrator to oscillate at a frequency close to the driving frequency of the crystal vibrator, the areas of the capacitor and the resistor of the CR oscillation circuit must be increased. This results in an increase in size and cost of a vibrating gyroscope (vibrating gyrosensor). According to the technology disclosed in JP-A-2004-286503, it is difficult to cause the crystal vibrator with a high Q value to operate at its driving frequency because the crystal vibrator is driven at another frequency during startup. Therefore, the period of time until stable oscillations are achieved increases when affected by manufacturing variations and the like. According to the technology disclosed in JP-A-2004-286503, the vibrator is driven by a rectangular wave after oscillations have started. Therefore, energy is lost even in the steady oscillation state, whereby power consumption increases as compared with the case of driving the vibrator by a sine wave.

The technology disclosed in JP-A-2003-240556 requires that a resistor be inserted. In general, when incorporating a resistor in an integrated circuit device, it is difficult to provide a vibrator with desired energy due to a large manufacturing variation in the resistor. According to the technology disclosed in JP-A-2003-240556, the gain is reduced because the energy applied to the vibrator is divided by the resistor.

SUMMARY

According to one aspect of the invention, there is provided a driver device that forms an oscillation loop with a vibrator and causes the vibrator to produce driving vibrations, the driver device comprising:

a current-voltage converter that is provided in the oscillation loop and converts a current that flows through the vibrator into a voltage; and a comparator that is provided in the oscillation loop and outputs a signal corresponding to a comparison result between an output from the current-voltage converter and a given voltage, the comparator outputting a first high-level voltage or a low-level voltage during oscillation startup, and outputting a second high-level voltage or the low-level voltage in a steady oscillation state; and the first high-level voltage being a voltage higher in potential than the second high-level voltage.

According to another aspect of the invention, there is provided a physical quantity measuring device that measures a physical quantity corresponding to a detection signal that is output from a vibrator based on driving vibrations produced by the vibrator and the physical quantity to be measured, the physical quantity measuring device comprising:

the vibrator;

the driver device as defined in claim 1 that causes the vibrator to produce the driving vibrations; and a detection device that detects an output signal corresponding to the physical quantity based on the detection signal, the detection device including a synchronous detector that synchronously detects the detection signal based on an output from the comparator.

According to another aspect of the invention, there is provided an electronic instrument comprising the above physical quantity measuring device.

DETAILED DESCRIPTION OF THE EMBODIMENT

Figure 1:
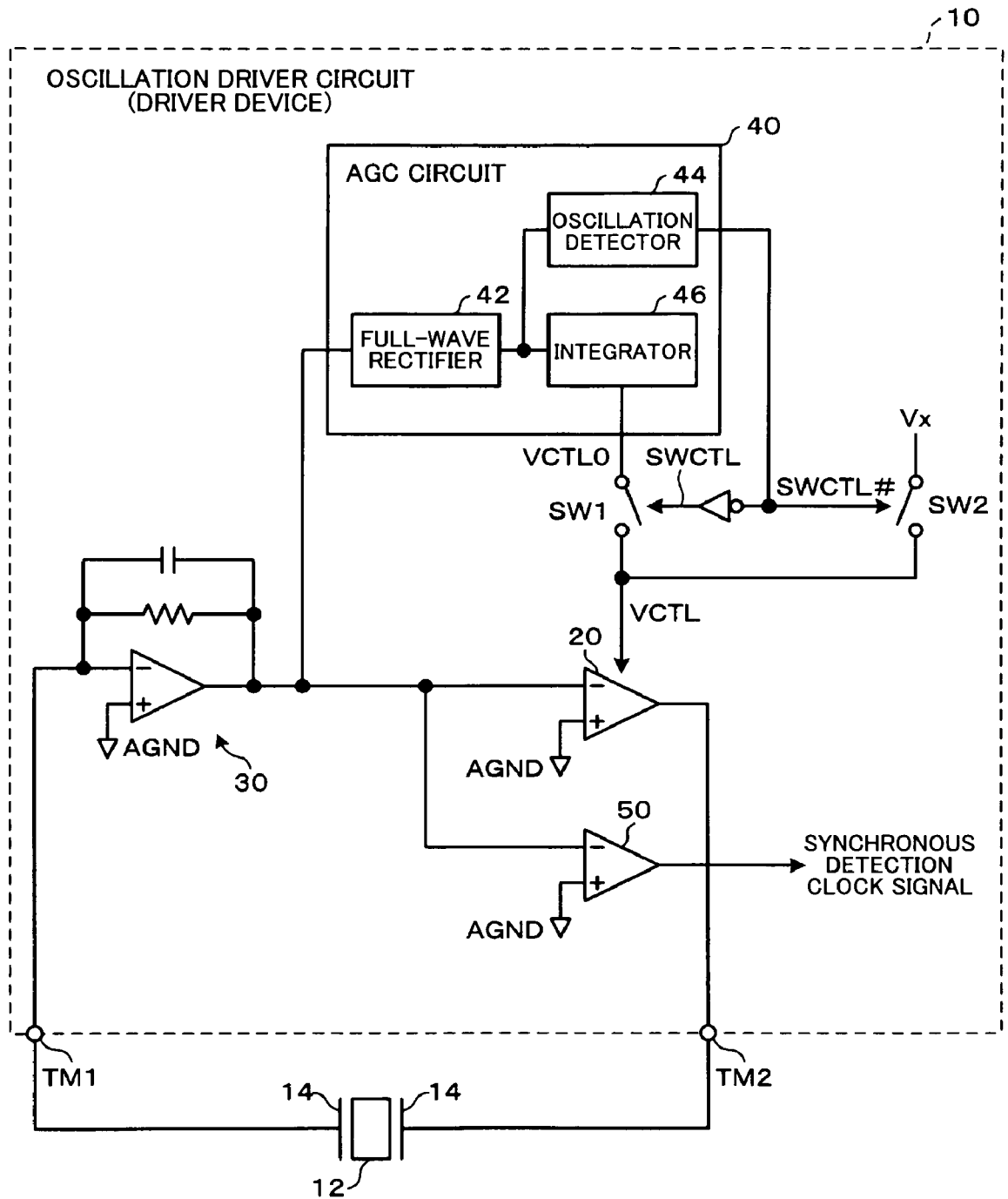
FIG. 1 is a circuit block diagram showing a configuration example of an oscillation driver circuit according to one embodiment of the invention.

Aspects of the invention may provide a driver device which can reduce the oscillation startup time without increasing the circuit scale, a physical quantity measuring device and an electronic instrument using the driver device, for example.

(1) According to one embodiment of the invention, there is provided a driver device that forms an oscillation loop with a vibrator and causes the vibrator to produce driving vibrations, the driver device comprising:

a current-voltage converter that is provided in the oscillation loop and converts a current that flows through the vibrator into a voltage; and a comparator that is provided in the oscillation loop and outputs a signal corresponding to a comparison result between an output from the current-voltage converter and a given voltage, the comparator outputting a first high-level voltage or a low-level voltage during oscillation startup, and outputting a second high-level voltage or the low-level voltage in a steady oscillation state; and the first high-level voltage being a voltage higher in potential than the second high-level voltage.

According to this embodiment, the driver device is used to form the oscillation loop with the vibrator and cause the vibrator to produce the driving vibrations. According to this embodiment, the comparator provided in the oscillation loop outputs the first high-level voltage or the low-level voltage during oscillation startup. The comparator outputs the second high-level voltage or the low-level voltage in a steady oscillation state subsequent to oscillation startup. Since the first high-level voltage is a voltage higher in potential than the second high-level voltage, oscillation startup can be accelerated using a very simple configuration.

(2) The driver device may include a comparator that generates a reference signal based on a signal in the oscillation loop, the reference signal being used to synchronously detect a detection signal that is output from the vibrator based on the driving vibrations produced by the vibrator and a physical quantity to be measured.

According to this embodiment, when measuring a physical quantity using an output signal that is obtained by synchronously detecting a detection signal output from the vibrator based on driving vibrations produced by the vibrator and the physical quantity to be measured, the synchronous detection process and oscillation startup can be accelerated without increasing the circuit scale.

(3) The driver device may include an oscillation detector that detects a signal from the vibrator, and the driver device may switch a high-level voltage output from the comparator from the first high-level voltage to the second high-level voltage based on a detection result of the oscillation detector.

(4) The driver device may switch the high-level voltage output from the comparator from the first high-level voltage to the second high-level voltage on condition that the oscillation detector has detected that a direct-current voltage obtained by converting the current that flows through the vibrator has reached a given threshold voltage.

According to the embodiment (3) or (4), since a switching element can be switch-controlled utilizing the signal detection result from the vibrator generally used for oscillation control of the oscillation loop, the synchronous detection process and oscillation startup can be accelerated without increasing the circuit scale.

(5) In the driver device, the first high-level voltage may be a voltage that causes a gain in the oscillation loop to be larger than unity.

According to this embodiment, since the gain in the oscillation loop becomes larger than unity during oscillation startup, oscillation startup can be reliably accelerated.

(6) In the driver device, the comparator may have a function of limiting the current that flows through the vibrator.

According to this embodiment, since the comparator has a function of limiting the current that flows through the vibrator, a situation can be reliably prevented in which the first high-level voltage increases during oscillation startup, whereby an excessive current is supplied to the vibrator.

(7) The driver device may include a limiter circuit that limits the first high-level voltage, and a voltage limited by the limiter circuit may be output as the first high-level voltage.

According to this embodiment, since the gain of the comparator can be controlled by limiting the first high-level voltage using the limiter circuit, a situation in which an excessive current is supplied to the vibrator can be prevented.

(8) In the driver device, the vibrator may be a capacitive-coupling vibrator; and the comparator may cause the vibrator to produce the driving vibrations by applying a rectangular-wave drive signal to the vibrator.

The rectangular-wave drive method has an advantage in that the variation in the drive signal is small. Moreover, since the voltage amplitude is easily controlled, the circuit configuration can be simplified, whereby the circuit scale can be reduced. When using the capacitive-coupling vibrator (vibrator in which a direct-current blocking capacitor lies in the signal path in the internal equivalent circuit), an arbitrary potential may be used as the direct-current potential of the oscillation loop, whereby the degree of freedom relating to the circuit configuration is increased. A piezoelectric element can be given as an example of the capacitive-coupling vibrator (capacitive vibrator).

(9) According to another embodiment of the invention, there is provided a physical quantity measuring device that measures a physical quantity corresponding to a detection signal that is output from a vibrator based on driving vibrations produced by the vibrator and the physical quantity to be measured, the physical quantity measuring device comprising:

the vibrator;

the driver device as defined in claim 1 that causes the vibrator to produce the driving vibrations; and a detection device that detects an output signal corresponding to the physical quantity based on the detection signal, the detection device including a synchronous detector that synchronously detects the detection signal based on an output from the comparator.

According to this embodiment, since switching of the output voltage during first-level output of the comparator can be controlled utilizing the signal detection result from the vibrator generally used for oscillation control of the oscillation loop, a physical quantity measuring device can be provided which accelerates the synchronous detection process and oscillation startup without increasing the circuit scale and allows a reduction in size and power consumption.

(10) In the physical quantity measuring device, the detection device may include a phase shifter that adjusts phases of the output from the comparator and the detection signal.

According to this embodiment, since the phase can be adjusted depending on a change in phase during a weak signal detection process, a highly accurate phase adjustment can be achieved while preventing an increase in circuit scale.

(11) According to another embodiment of the invention, there is provided an electronic instrument comprising one of the above physical quantity measuring devices.

This embodiment contributes to reducing the size and the power consumption of an electronic instrument which performs a given process using the physical quantity measurement results.

Embodiments of the invention are described in detail below with reference to the drawings. Note that the embodiments described below do not in any way limit the scope of the invention laid out in the claims. Note that all elements of the embodiments described below should not necessarily be taken as essential requirements for the invention.

First Embodiment

This embodiment illustrates an example of the configuration and the operation of a driver device (oscillation driver circuit).

1. Driver Device

FIG. 1 is a block diagram showing a configuration example of an oscillation driver circuit (driver device) according to this embodiment. The oscillation driver circuit (driver device) according to this embodiment is used to measure a physical quantity using an output signal obtained by synchronously detecting a detection signal output from a vibrator based on driving vibrations produced by the vibrator and the physical quantity to be measured.

An oscillation driver circuit 10 includes first and second connection terminals TM1 and TM2 (electrodes or pads). A vibrator 12 is inserted between the first and second connection terminals at a position outside the oscillation driver circuit 10. An excitation means 14 is attached to the vibrator 12. The excitation means 14 is connected with the oscillation driver circuit 10 to form an oscillation loop. Oscillation starts in a state in which the gain of a driver provided in the oscillation driver circuit 10 is large (i.e., larger than unity). In this state, only noise is input to the driver. The noise contains wave motions at a wide range of frequencies including the natural resonance frequency of the desired driving vibrations. The noise is input to the vibrator 12.

The vibrator 12 is formed of a piezoelectric single crystal as described later, for example. A signal containing a large amount of wave motions at the desired natural resonance frequency is output due to the frequency filtering effect of the vibrator 12, and is input to the driver. The above operation is repeated in the oscillation loop so that the percentage of the signal at the desired natural resonance frequency increases, whereby the amplitude of the signal input to the driver increases.

In the steady oscillation state, the output current from the vibrator 12 is converted into a voltage value using a current-voltage converter 30, and the oscillation amplitude in the oscillation loop is controlled using an auto gain control (AGC) circuit 40 based on the voltage value. This causes the gain (loop gain) while the signal goes around the oscillation loop to become unity, whereby the vibrator 12 stably oscillates.

It is indispensable to cause the vibrator to stably oscillate when measuring the physical quantity. Specifically, if the amplitude of the drive signal produced by the vibrator is not constant, the output signal from the vibrator does not become constant, whereby the physical quantity cannot be accurately measured.

It is also indispensable to accelerate the oscillation startup of the vibrator in order to reduce the power consumption of the system including the vibrator and the oscillation driver circuit. Specifically, oscillations can be produced only when required by promptly obtaining stable oscillations, whereby an operation period in which power is unnecessarily consumed can be reduced.

In this embodiment, the oscillation driver circuit 10 utilizes a gain control amplifier (hereinafter abbreviated as GCA) 20 (comparator in a broad sense), which functions as a comparator, as driver during oscillation startup. The GCA 20 has a three-value output function of outputting a first high-level voltage, a second high-level voltage, or a low-level voltage. Specifically, the GCA 20 outputs the high-level voltage or the low-level voltage depending on its input level. The high-level voltage is classified as the first high-level voltage and the second high-level voltage which is higher in potential than the first high-level voltage.

The oscillation driver circuit 10 outputs the first high-level voltage or the low-level voltage during oscillation startup and outputs the second high-level voltage or the low-level voltage in a steady oscillation state utilizing the GCA 20. Specifically, the output voltage supplied to the vibrator 12 during high-level output of the GCA 20 is set at a given first high-level voltage Vx, and is set at the second high-level voltage controlled by the AGC circuit 40 in a steady oscillation state. The first high-level voltage Vx is a voltage which causes the gain in the oscillation loop to be larger than unity.

Various configurations may be employed to change the output level of the GCA 20 between the first high-level voltage Vx and the second high-level voltage. This embodiment employs a configuration which changes the power supply voltage of an output-stage circuit (i.e., output-stage CMOS inverter) of the GCA 20, for example. Specifically, when the power supply voltage of the output-stage CMOS inverter of the GCA 20 is set at the first high-level voltage Vx, the voltage level of the output from the CMOS inverter (i.e., GCA 20) is set at the first high-level voltage Vx. When the power supply voltage of the output-stage CMOS inverter of the GCA 20 is set at the second high-level voltage (e.g., a voltage which maintains the gain in the oscillation loop at unity), the voltage level of the output from the CMOS inverter (i.e., GCA 20) is set at the second high-level voltage. It is desirable that the first high-level voltage Vx be a voltage which can cause the gain in the oscillation loop to be larger than unity, as described above.

Specifically, the first high-level voltage Vx is a high-level power supply voltage (VDD) of the circuit, for example. Note that the first high-level voltage Vx is not limited thereto. The first high-level voltage Vx may be a boosted voltage higher than the voltage VDD, or may be a voltage lower than the voltage VDD to some extent.

The first high-level voltage Vx may be a negative power supply voltage with respect to ground (GND), for example. Specifically, the term "high-level voltage" means that the potential difference between the high-level voltage and a reference potential (e.g., GND) is larger than the potential difference between the low-level voltage and the reference potential (e.g., GND).

The oscillation driver circuit 10 according to this embodiment includes first and second switching elements SW1 and SW2 in order to generate a control signal VCTL which controls the gain of the GCA 20. The first switching element SW1 is an element used to transmit a control signal VCTL0 generated by the AGC circuit 40 so that the oscillation loop satisfies a steady oscillation condition as the control signal VCTL of the GCA 20. The second switch element SW2 is an element used to transmit the given first high-level voltage Vx as the control signal VCTL of the GCA 20.

The first high-level voltage Vx may be a voltage generated by the oscillation driver circuit 10, or may be a voltage supplied from the outside of the oscillation driver circuit 10. The first high-level voltage Vx may be a voltage generated by causing the oscillation driver circuit 10 to boost or divide (using resistors) a voltage generated by the oscillation driver circuit 10 or supplied from the outside of the oscillation driver circuit 10.

The first switching element SW1 is ON/OFF-controlled using a switch control signal SWCTL. The second switching element SW2 is ON/OFF-controlled using a switch control signal SWCTL#. The switch control signal SWCTL# is an inversion signal of the switch control signal SWCTL.

The oscillation driver circuit 10 includes a synchronous-detection comparator 50, a signal in the oscillation loop which has been converted into a voltage value by the current-voltage converter 30 being input to the synchronous detection comparator 50. The oscillation driver circuit 10 outputs the output from the synchronous detection comparator 50 as a synchronous detection clock signal (synchronous detection reference signal). Specifically, the comparator 50 generates the reference signal used to synchronously detect a detection signal output from the vibrator 12 based on driving vibrations produced by the vibrator 12 and a physical quantity to be measured based on the signal in the oscillation loop.

The AGC circuit 40 includes a full-wave rectifier 42, an oscillation detector 44, and an integrator 46. The full-wave rectifier 42 converts the voltage value converted by the current-voltage converter 30 into a voltage value as a direct-current signal. The oscillation detector 44 detects whether or not the oscillation loop including the vibrator 12 is in an oscillation state based on the voltage value converted by the full-wave rectifier 42, and generates the switch control signal SWCTL# (or switch control signal SWCTL) corresponding to the detection result. For example, the oscillation detector 44 compares the voltage value converted by the full-wave rectifier 42 with a given reference voltage value, and generates the switch control signal SWCTL# (or switch control signal SWCTL) based on the comparison result. The integrator 46 generates the control signal VCTL0 for the GCA 20 to control oscillations in the oscillation loop based on an integration result of the voltage value converted by the full-wave rectifier 42. For example, the integrator 46 integrates the voltage value converted by the full-wave rectifier 42 to determine the level of the direct-current component, compares the determined level with a given reference signal level, and generates the control signal VCTL0 based on the comparison result. For example, the high-potential-side power supply voltage of the circuit (output circuit) in the output stage (final stage) of the GCA 20 is controlled based on the control signal VCTL0 or the first high-level voltage Vx.

According to this embodiment, the high-potential-side voltage output from the GCA 20 which is provided in the oscillation loop and functions as a comparator during H level output is controlled so that the gain in the oscillation loop becomes larger than unity during oscillation startup and becomes unity in a steady oscillation state, as described above.

The AGC circuit 40 performs switch control of the first and second switching elements SW1 and SW2 to output the first high-level voltage Vx to the GCA 20 during oscillation startup and output the control signal VCTL0 to the GCA 20 in a steady oscillation state.

In this embodiment, the term "oscillation startup" may be a period until a steady oscillation state is achieved after supplying power to the oscillation driver circuit 10 or a period until a steady oscillation state is achieved after the oscillation driver circuit 10 has recovered from a sleep operation mode.

Figure 2:
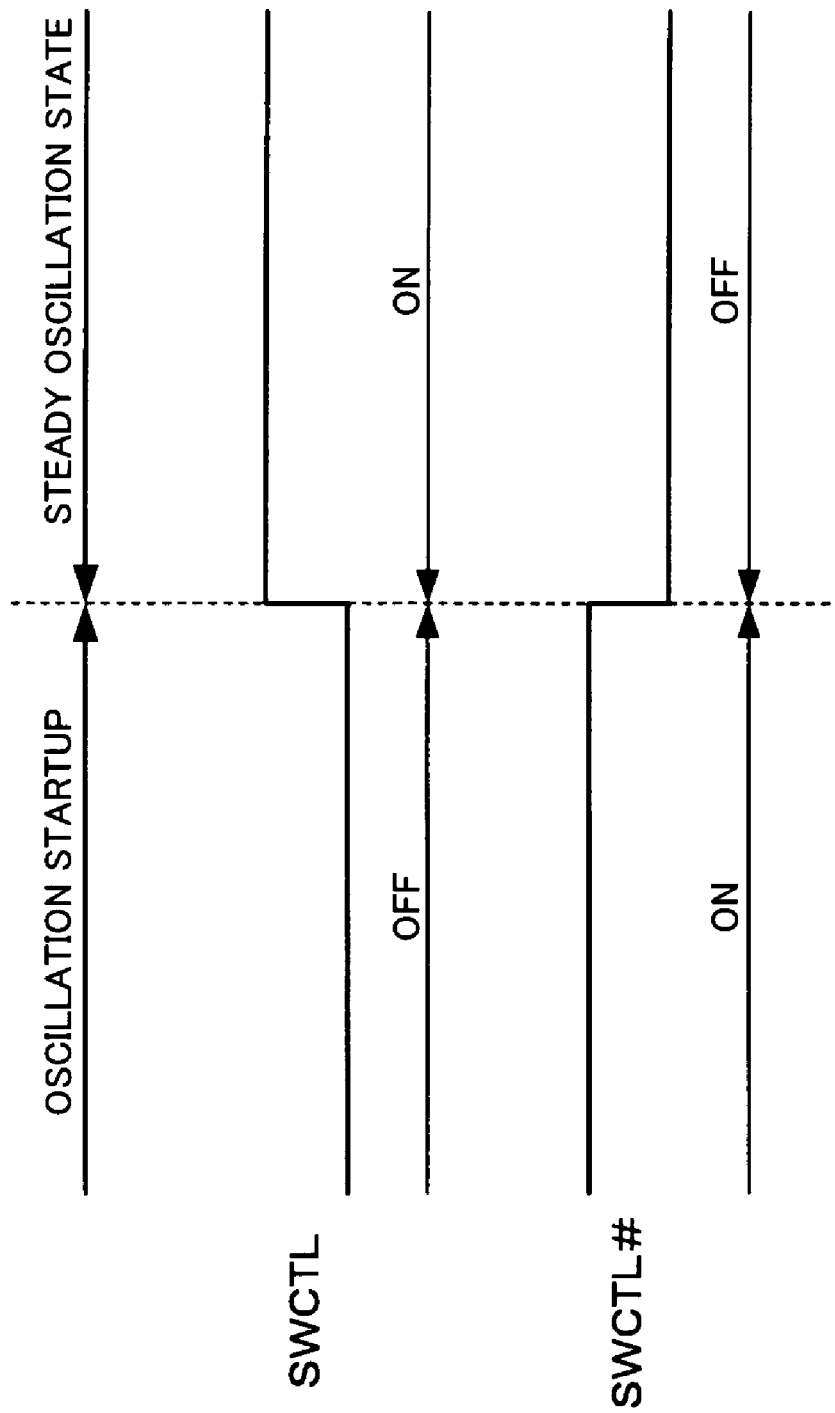
FIG. 2 is a timing diagram showing an example of a switch control signal shown in FIG. 1.

FIG. 2 is a timing waveform diagram of the switch control signals SWCTL and SWCTL#.

During oscillation startup such as immediately after supplying power, the oscillation detector 44 of the AGC circuit 40 detects that the voltage value obtained by converting the current signal from the vibrator 12 is lower than the given reference voltage value, and the oscillation detector 44 generates the switch control signal SWCTL# set at the H level (or switch control signal SWCTL set at the L level). This causes the first switching element SW1 to be turned OFF and the second switching element SW2 to be turned ON. In this case, the first high-level voltage Vx is supplied as the control signal VCTL of the GCA 20. Therefore, an amplification operation is performed at a very large gain during H level output of the GCA 20, whereby the gain in the oscillation loop formed by the vibrator 12, the current-voltage converter 30, and the GCA 20 becomes larger than unity. As a result, the vibrator 12 is caused to produce driving vibrations during oscillation startup so that the gain in the oscillation loop including the vibrator 12 and the GCA 20 is larger than unity and the phase in the oscillation loop is 360×n (n is an integer).

When the oscillation detector 44 has detected that the voltage value obtained by converting the current signal from the vibrator 12 is higher than the given reference voltage value, the oscillation detector 44 generates the switch control signal SWCTL# set at the L level (or switch control signal SWCTL set at the H level). This causes the first switching element SW1 to be turned ON and the second switching element SW2 to be turned OFF. In this case, the control signal VCTL0 from the integrator 46 is supplied as the control signal VCTL of the GCA 20. Therefore, the GCA 20 is controlled so that the gain in the oscillation loop formed by the vibrator 12, the current-voltage converter 30, and the GCA 20 becomes unity. As a result, oscillation startup ends and transitions to a steady oscillation state. In the steady oscillation state, the vibrator 12 is caused to produce driving vibrations so that the gain in the oscillation loop including the vibrator 12 and the GCA 20 is unity and the phase in the oscillation loop is 360×n.

In this embodiment, the high-potential-side voltage during H level output of the GCA 20 is controlled based on the detection result of the oscillation detector 44. Specifically, the first high-level voltage Vx is switched to the control signal VCTL on condition that the oscillation detector 44 has detected that the direct-current voltage obtained by converting the current flowing through the vibrator 12 has reached the given threshold voltage. Specifically, the first high-level voltage Vx can be switched to the second high-level voltage on condition that the oscillation detector 44 has detected that the direct-current voltage obtained by converting the current flowing through the vibrator 12 has reached the given threshold voltage. This enables the switching element to be switch-controlled utilizing the signal detection result from the vibrator 12 generally used to control oscillations in the oscillation loop, whereby a high-speed oscillation startup can be implemented without increasing the circuit scale to a large extent.

In this embodiment, the output from the comparator 50 is output as the synchronous detection clock signal in the steady oscillation state. Therefore, when measuring the physical quantity using the output signal obtained by synchronously detecting the detection signal output from the vibrator 12 based on driving vibrations produced by the vibrator 12 and the physical quantity to be measured, the synchronous detection process and oscillation startup can be accelerated without increasing the circuit scale.

It is preferable that the synchronous detection comparator 50 have a gain as large as possible. This increases the accuracy of the synchronous detection clock signal output in the steady oscillation state.

Figure 3:
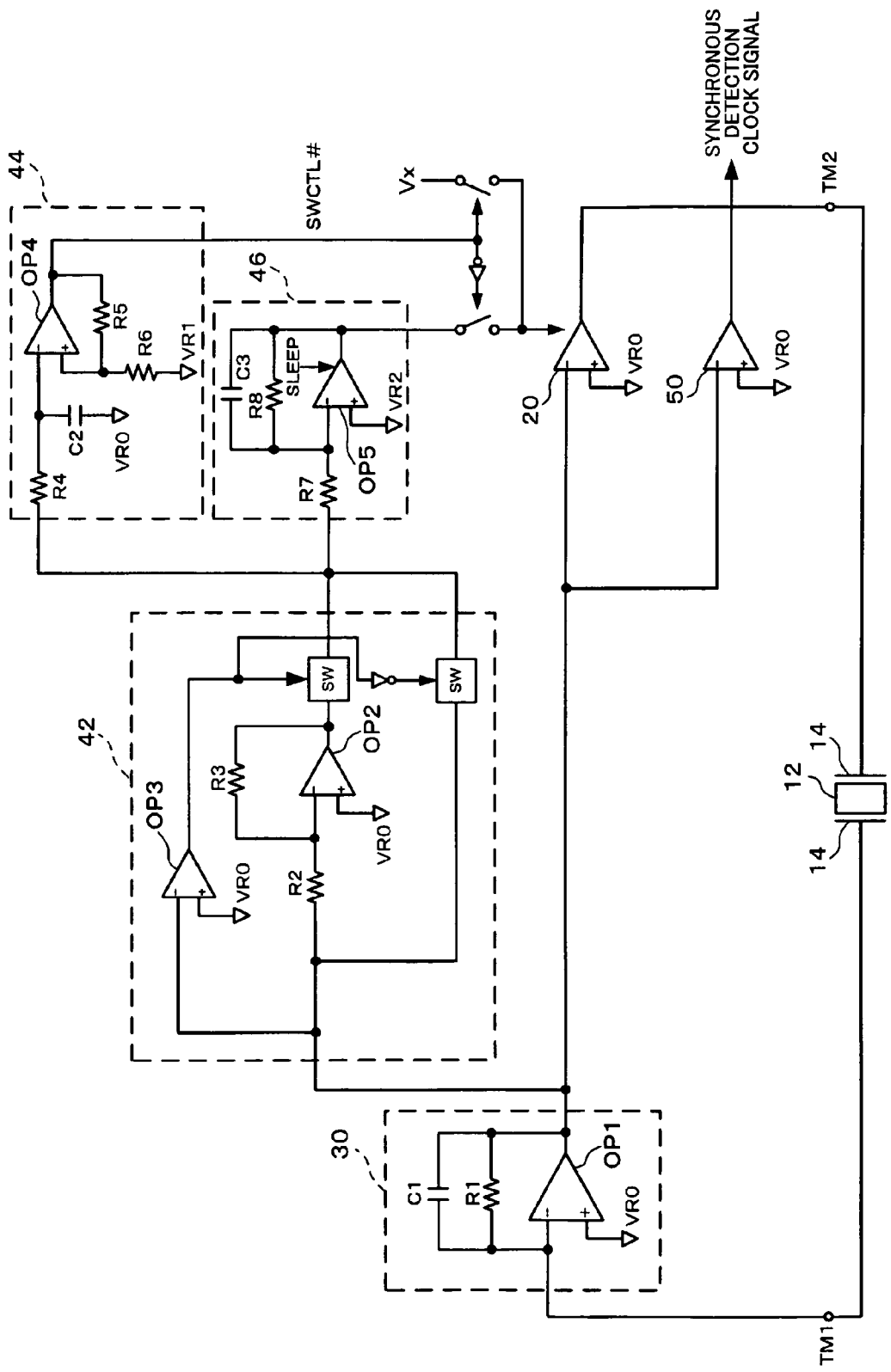
FIG. 3 is a view showing a detailed circuit example of the oscillation driver circuit shown in FIG. 1.

FIG. 3 is a circuit diagram showing a detailed configuration example of the oscillation driver circuit 10 shown in FIG. 1. In FIG. 3, the same sections as in FIG. 1 are indicated by the same symbols. Description of these sections is appropriately omitted.

The current-voltage converter 30 includes an operational amplifier OP1, a feedback capacitor C1, and a feedback resistor R1. A given reference voltage VR0 is supplied to the non-inverting input terminal (+) of the operational amplifier OP1, and the first connection terminal TM1 is electrically connected with the inverting input terminal (−).

The full-wave rectifier 42 includes operational amplifiers OP2 and OP3 and resistors R2 and R3. The operational amplifier OP2 and the resistors R2 and R3 function as an inverting circuit. The operational amplifier OP3 functions as a comparator which compares the output voltage of the current-voltage converter 30 with the reference voltage VR0. The full-wave rectifier 42 includes a switching element provided on the output side of the operational amplifier OP2, and a switching element which bypasses the input and the output of the full-wave rectifier 42. These switching elements are exclusively ON/OFF-controlled based on the output signal from the operational amplifier OP3.

The oscillation detector 44 includes a low pass filter (hereinafter abbreviated as "LPF") and an operational amplifier OP4. The LPF includes a resistor R4 and a capacitor C2. The resistor R4 is inserted in series between the input and the output of the LPF. One end of the capacitor C2 is electrically connected with the output node of the LPF. A reference voltage VR1 is supplied to the other end of the capacitor C2. The cut-off frequency of the LPF is $1/(2\pi \times C2 \times R4)$. The output node of the LPF is connected with the inverting input terminal of the operational amplifier OP4. A resistor R5 is inserted as a feedback resistor between the output and the non-inverting input terminal of the operational amplifier OP4. The reference voltage VR1 is supplied to the non-inverting input terminal of the operational amplifier OP4 through a resistor R6. The output signal from the operational amplifier OP4 is output as the switch control signal SWCTL#.

The integrator 46 includes an operational amplifier OP5, resistors R7 and R8, and a capacitor C3. The capacitor C3 is connected as a feedback capacitor of the operational amplifier OP5. The resistor R8 is inserted as a feedback resistor of the operational amplifier OP5. The resistor R7 is inserted between the inverting input terminal of the operational amplifier OP5 and the output node of the full-wave rectifier 42. In the integrator 46, the gain is controlled while reducing the effects of the input voltage offset and the input current offset using the resistors R7 and R8. A reference voltage VR2 is supplied to the non-inverting input terminal of the operational amplifier OP5. The integrator 46 functions as an LPF utilizing the capacitor C3 and the resistor R8. The cut-off frequency is $1/(2\pi \times C3 \times R8)$. The output signal from the operational amplifier OP5 is output as the control signal VCTL0.

The current which flows through the vibrator 12 during oscillation startup is referred to as Id, and the current which flows through the vibrator 12 in the steady oscillation state is referred to as Id'. The reference voltage VR2 is expressed by the following equation taking into account smoothing by the current-voltage converter 30, $$VR2 = (Id \times R1 \times 2/\pi) + VR0 \qquad (1)$$

where, R1 indicates the resistance of the feedback resistor of the current-voltage converter 30. Likewise, the reference voltage VR1 is expressed by the following equation.

$$VR1 = (Id' \times R1 \times 2/\pi) + VR0 \qquad (2)$$

Since Id'<Id, the reference voltage VR2 is higher than the reference voltage VR1. It is preferable that the reference voltages VR1 and VR2 have the following relationship with the reference voltage VR0.

$$VR0 < VR1 < VR2 \qquad (3)$$

Figure 4A:
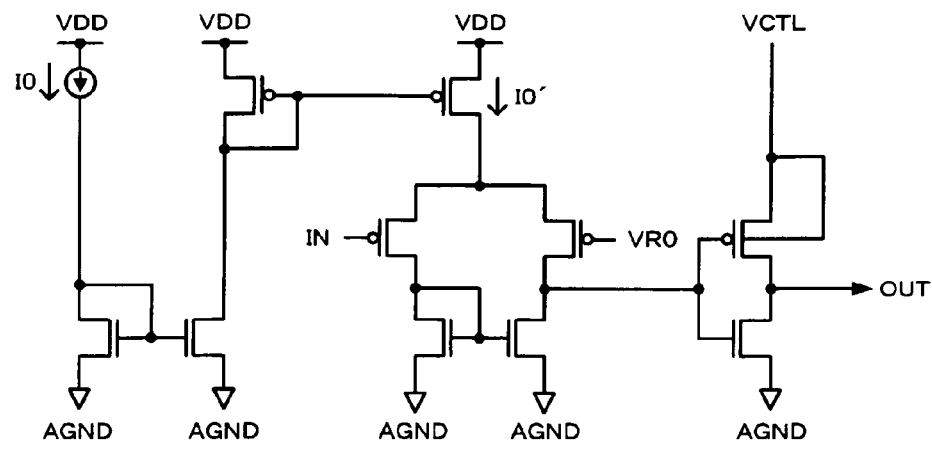
FIGS. 4A and 4B are circuit diagrams showing a configuration example of a GCA 20 shown in FIG. 1.
Figure 4B:
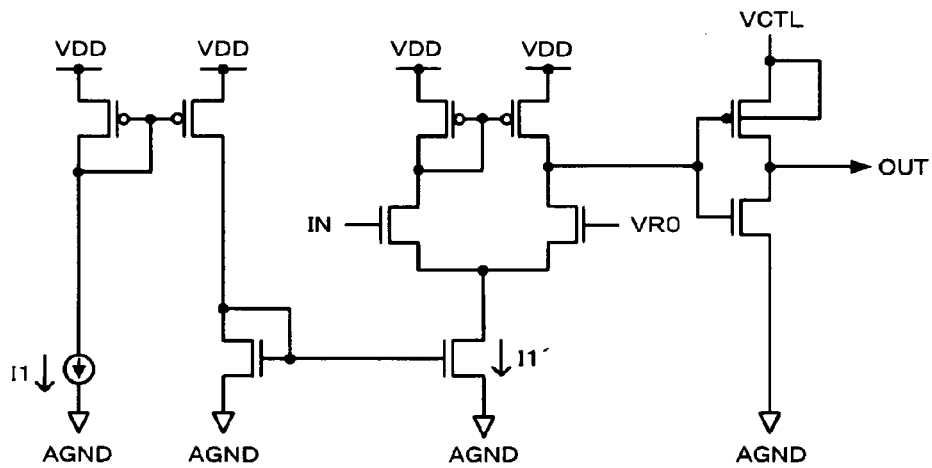

FIGS. 4A and 4B are circuit diagrams showing a configuration example of the GCA 20 shown in FIG. 3.

FIG. 4A shows a configuration example when forming the GCA 20 using a P-type differential amplifier, and FIG. 4B shows a configuration example when forming the GCA 20 using an N-type differential amplifier.

In FIG. 4A, a current I0 generated by a current source is supplied as an operating current I0' of the P-type differential amplifier through two current-mirror circuits. The voltage of the output node of the current-voltage converter 30 is supplied to the gate of one of a pair of P-type differential transistors of the P-type differential amplifier as an input signal IN. The reference voltage VR0 is supplied to the gate of the other P-type differential transistor of the P-type differential amplifier. The output voltage of the P-type differential amplifier is supplied to an output buffer. The signal output from the output buffer is supplied to the vibrator 12.

The high-potential-side power supply voltage and the low-potential-side power supply voltage of the two current-mirror circuits and the P-type differential amplifier are voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

Specifically, the output voltage from the GCA 20 during H level output can be set at the first high-level voltage Vx by supplying the first high-level voltage Vx to the GCA 20 as the control signal VCTL during oscillation startup. The output voltage from the GCA 20 during H level output can be set at the control signal VCTL0 by supplying the control signal VCTL0 (second high-level voltage) to the GCA 20 as the control signal VCTL in the steady oscillation state.

In FIG. 4B, a current I1 generated by a current source is supplied as an operating current I1' of the N-type differential amplifier through two current-mirror circuits. The voltage of the output node of the current-voltage converter 30 is supplied to the gate of one of a pair of N-type differential transistors of the N-type differential amplifier as the input signal IN. The reference voltage VR0 is supplied to the gate of the other N-type differential transistor of the N-type differential amplifier. The output voltage of the N-type differential amplifier is supplied to an output buffer. The signal output from the output buffer is supplied to the vibrator 12.

The high-potential-side power supply voltage and the low-potential-side power supply voltage of the two current-mirror circuits and the N-type differential amplifier are the voltages VDD and AGND, respectively. The output buffer is an inverter circuit including a P-type output transistor and an N-type output transistor. The voltage AGND is supplied to the source of the N-type transistor of the output buffer, and the control signal VCTL from the AGC circuit 40 is supplied to the source of the P-type transistor. Therefore, the output voltage of the output buffer can be changed by changing the control signal VCTL.

Specifically, the output voltage from the GCA 20 during H level output can be set at the first high-level voltage Vx by supplying the first high-level voltage Vx to the GCA 20 as the control signal VCTL during oscillation startup. The output voltage from the GCA 20 during H level output can be set at the control signal VCTL0 by supplying the control signal VCTL0 to the GCA 20 as the control signal VCTL in the steady oscillation state.

In FIGS. 4A and 4B, a substrate bias effect can be prevented by applying the control signal VCTL as the substrate potential of the P-type output transistor of the output buffer.

2. Modification

The configuration of the oscillation driver circuit according to the invention is not limited to the configuration according to this embodiment. In a modification of this embodiment, it is desirable that the GCA 20 have a function of limiting current flowing through the vibrator 12 so that an excessive current is not supplied to the vibrator 12 during oscillation startup, for example. In this modification, a limiter circuit is provided so that an excessive current is not supplied to the vibrator 12.

Figure 5:
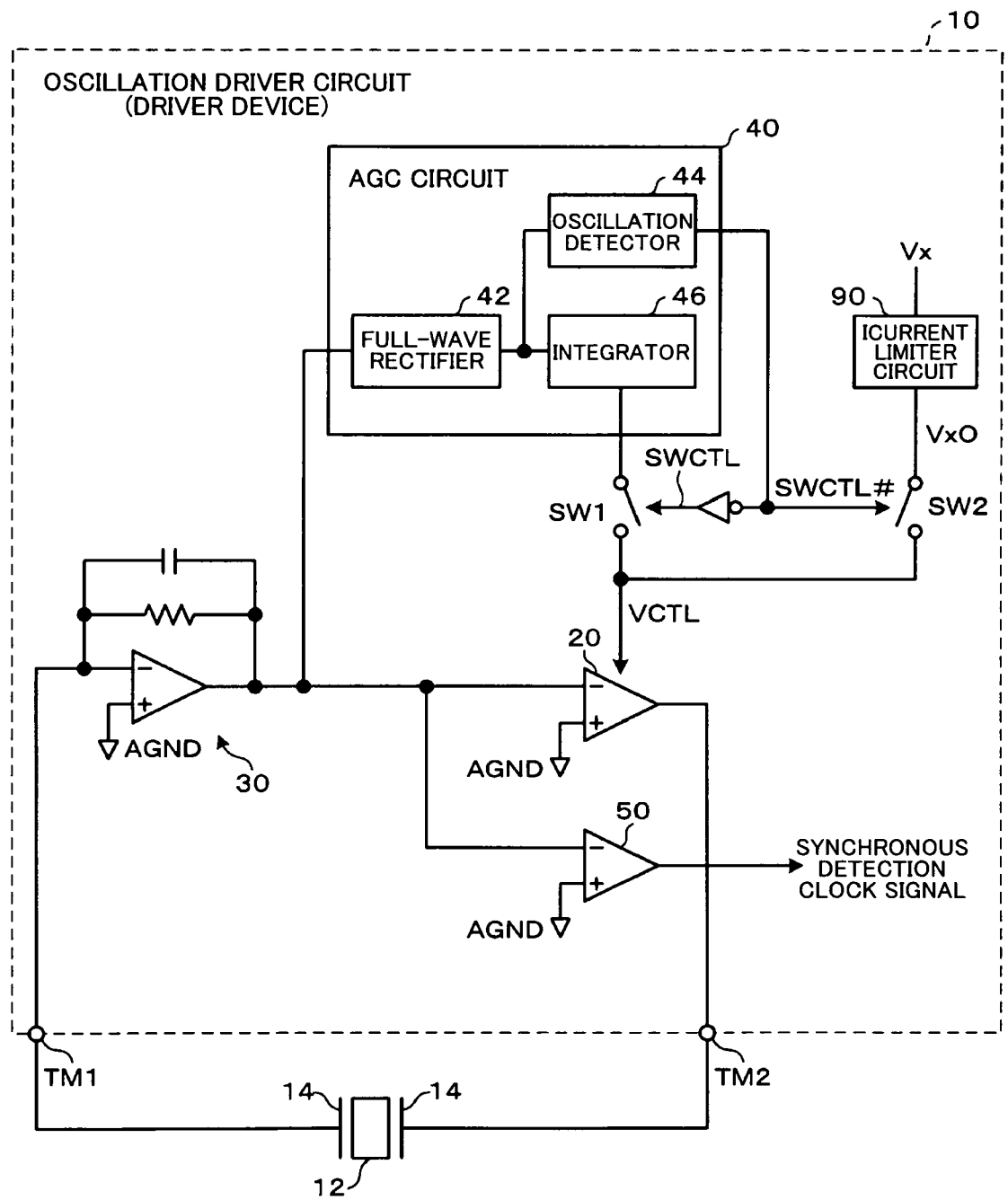
FIG. 5 is a circuit block diagram showing a configuration example of an oscillation driver circuit according to a modification of one embodiment of the invention.

FIG. 5 shows a configuration example of the oscillation driver circuit 10 according to the modification of this embodiment.

In FIG. 5, the same sections as shown in FIG. 1 are indicated by the same symbols. Description of these sections is appropriately omitted.

In FIG. 5, the first high-level voltage Vx is supplied to a current limiter circuit (limiter circuit in a broad sense) 90, and an oscillation startup limited voltage VxO limited by the current limiter circuit 90 is supplied to the second switching element SW2. Therefore, the oscillation startup limited voltage VxO is supplied as the control signal VCTL of the GCA 20 during oscillation startup.

Specifically, the voltage limited by the current limiter circuit 90 is output as the output voltage from the GCA 20 during oscillation startup during high-level output of the GCA 20.

The gain of the GCA 20 can be controlled limiting the first high-level voltage Vx using the current limiter circuit 90, whereby an excessive current can be prevented from being supplied to the vibrator 12.

Figure 6:
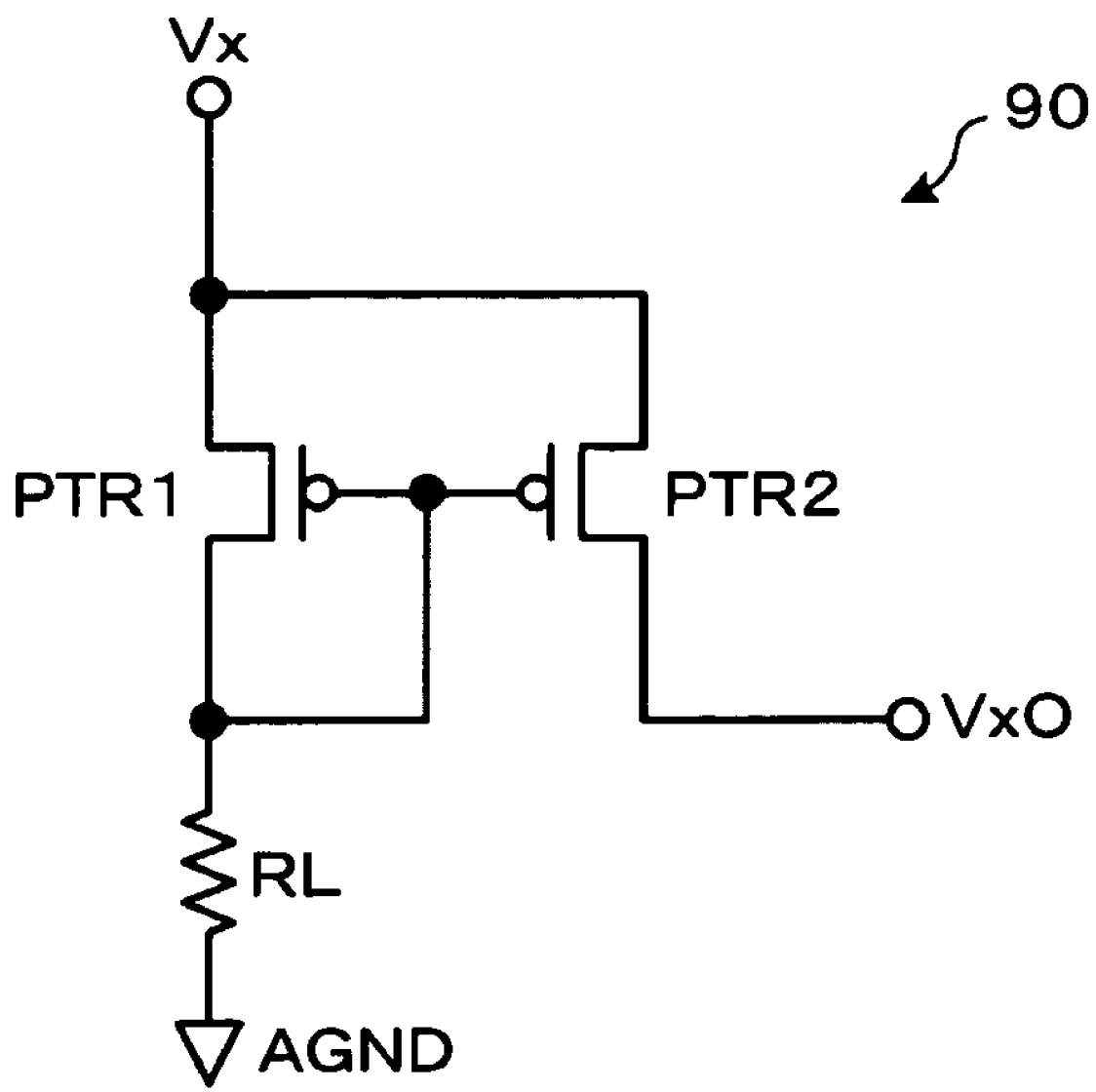
FIG. 6 is a circuit diagram showing a configuration example of a current limiter circuit shown in FIG. 5.

FIG. 6 is a circuit diagram showing a configuration example of the current limiter circuit 90 shown in FIG. 5.

The current limiter circuit 90 includes P-type transistors PTR1 and PTR2 and a resistor RL, the first high-level voltage Vx being supplied to the sources of the P-type transistors PTR1 and PTR2. The gate and the drain of the P-type transistor PTR1 are connected. The gates of the P-type transistors PTR1 and PTR2 are connected. One end of the resistor RL is connected with the drain of the P-type transistor PTR1, and the voltage AGND is supplied to the other end of the resistor RL. In the current limiter circuit 90, a current-mirror circuit is formed by the P-type transistors PTR1 and PTR2, and the oscillation startup limited voltage VxO is generated so that a drain current corresponding to the current flowing through the resistor RL occurs in the P-type transistor PTR2.

The oscillation startup limited voltage VxO thus generated is supplied as the control signal VCTL of the GCA 20 during oscillation startup. Therefore, the first high-level voltage Vx can be limited by adjusting the resistor RL and the current drive capability ratio of the P-type transistors PTR1 and PTR2. As a result, a situation can be prevented in which the gain of the GCA 20 increases to a large extent, whereby the vibrator 12 breaks.

3. Oscillation Conditions During Oscillation Startup and Stable Oscillations

The oscillation driver circuit (driver device) 10 shown in FIG. 1 drives a physical quantity transducer 12 by means of the oscillation loop. In the oscillation driver circuit 10 according to this embodiment, the loop gain is set to be larger than unity during oscillation startup in order to enable high-speed startup. Specifically, the oscillation conditions during oscillation startup are satisfied when the loop gain is larger than unity and the phase in the loop is 360°×n (n is an integer). The oscillation conditions during stable oscillations are satisfied when the loop gain is unity and the phase in the loop is 360°×n (n is an integer).

4. Power Supply Voltage of Oscillation Driver Circuit

The oscillation driver circuit 10 shown in FIG. 1 operates between the voltage VDD (high-potential power supply voltage) and the voltage AGND (reference potential). The voltage AGND is a ground potential, for example. Note that another reference potential may be used instead of the ground potential. Specifically, the power supply potential which may be used differs depending on the type of vibrator 12.

When the vibrator 12 is a capacitive-coupling transducer (configuration in which a direct-current blocking capacitor lies in the signal path in the internal equivalent circuit), direct current is cut off. Therefore, with regard to the direct current level (bias point) of the oscillation loop, it suffices that the voltage amplitude of the drive signal of the oscillation loop be adjusted regardless of the circuit operation. Therefore, an arbitrary potential may be basically used as the low-potential-side power supply, for example.

When the vibrator 12 is a variable-resistance transducer, it is necessary to set the bias voltage of the oscillation loop at a desired level. Therefore, a reference voltage at a desired level is generally used.

The power supply method is classified as a single power supply method (method using only a positive power supply) and a dual power supply method (method using positive and negative power supplies). The latter method is used particularly when accuracy is important.

Note that the invention may employ either of the above power supply methods. In FIG. 1 (and other drawings), the vibrator 12 is a capacitive-coupling transducer as is clear from the equivalent circuits shown in FIGS. 8A and 8B. The above description has been given on the assumption that a single power supply method is employed and the oscillation driver circuit 200 operates between the voltage VDD (e.g. 5 V) and the voltage GND (ground potential).

5. Rectangular-Wave Drive, Sine-Wave Drive, and Capacitive-Coupling Vibrator

The driver device according to this embodiment shown in FIG. 1 may employ rectangular-wave drive and sine-wave drive.

Figure 8A:
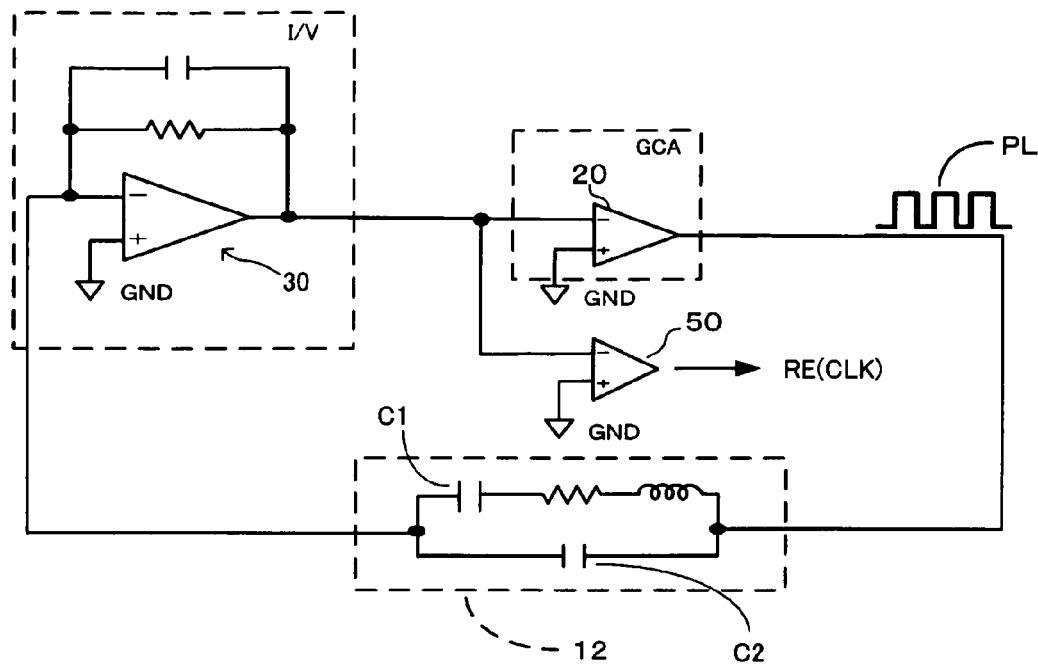
FIGS. 8A and 8B are circuit diagrams illustrative of rectangular wave drive, sine wave drive, and a capacitive-coupling vibrator.
Figure 8B:
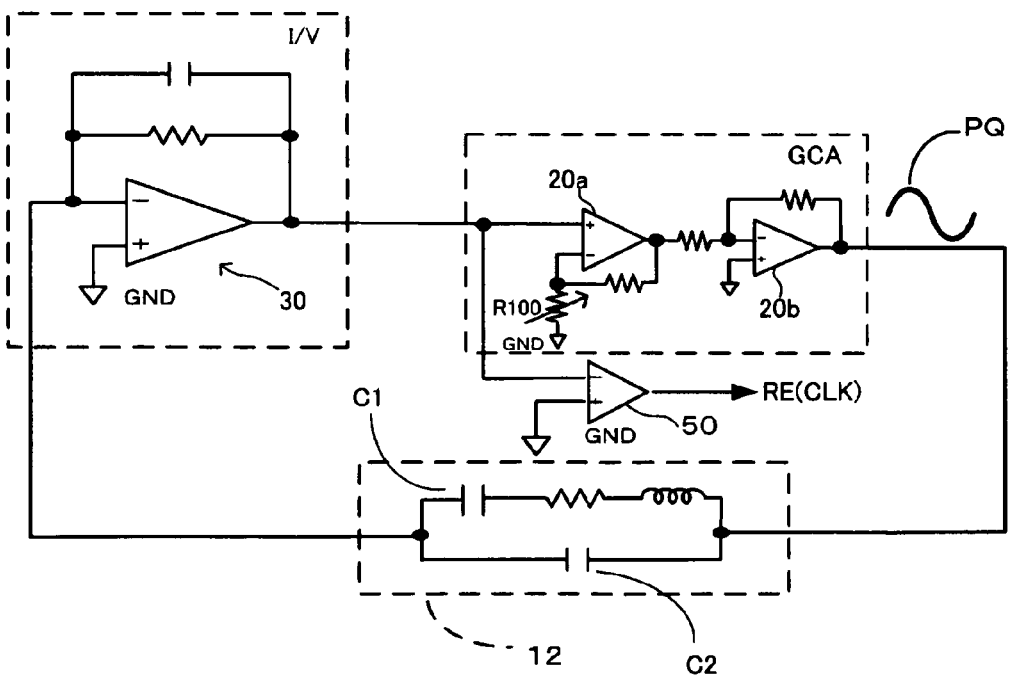

FIGS. 8A and 8B are circuit diagrams illustrative of rectangular-wave drive, sine-wave drive, and a capacitive-coupling vibrator. FIG. 8A shows the major portion of the driver device which performs rectangular wave drive. As shown in FIG. 8A, the vibrator 12 is driven by a rectangular-wave drive signal (PL). The gain of the oscillation loop can be easily controlled by adjusting the high-level voltage or the low-level voltage of the drive signal (PL).

The rectangular-wave drive method has an advantage in that the variation in the drive signal (PL) is small. Moreover, since the voltage amplitude of the drive signal is easily controlled, the circuit configuration can be simplified, whereby the circuit scale can be reduced.

FIG. 8B shows the main portion of the driver device which performs sine-wave drive. As shown in FIG. 8B, the vibrator 12 is driven by a sine-wave drive signal (PQ). The gain of the oscillation loop can be adjusted by variably controlling the resistance of a variable resistor R100 of a preceding-stage amplifier 20a included in gain control amplifier (GCA).

In FIGS. 8A and 8B, a capacitive-coupling vibrator is used as the vibrator 12. Note that the vibrator 12 is not limited thereto. Various vibrators such as a variable-resistance vibrator may also be used.

The capacitive-coupling vibrator (capacitive vibrator) is a vibrator in which a direct-current blocking capacitor (C1 and C2 in FIGS. 8A and 8B) lies in the signal path in the internal equivalent circuit. A piezoelectric element can be given as an example of the capacitive-coupling vibrator (capacitive vibrator).

When using a capacitive-coupling vibrator, an arbitrary potential may be used as the direct-current potential of the oscillation loop. Therefore, the degree of freedom relating to the circuit configuration is increased.

Type of Vibrator

In this embodiment, a capacitive-coupling vibrator is used as the vibrator 12, as described above. Note that the vibrator 12 is not limited thereto. Various vibrators such as a variable-resistance vibrator may also be used.

The capacitive-coupling vibrator (capacitive vibrator) is a vibrator in which a direct-current blocking capacitor lies in the signal path in the internal equivalent circuit, as shown in FIGS. 8A and 8B. A piezoelectric element can be given as an example of the capacitive-coupling vibrator (capacitive vibrator).

When using a capacitive-coupling vibrator, an arbitrary potential may be used as the direct-current potential of the oscillation loop. Therefore, a circuit can be formed without taking the direct-current potential into account, whereby the degree of freedom of the circuit configuration is increased.

Second Embodiment

This embodiment illustrates a vibrating gyrosensor which includes the driver device according to the invention and a vibrator driven by the driver device.

6. Vibrating Gyrosensor

Figure 7:
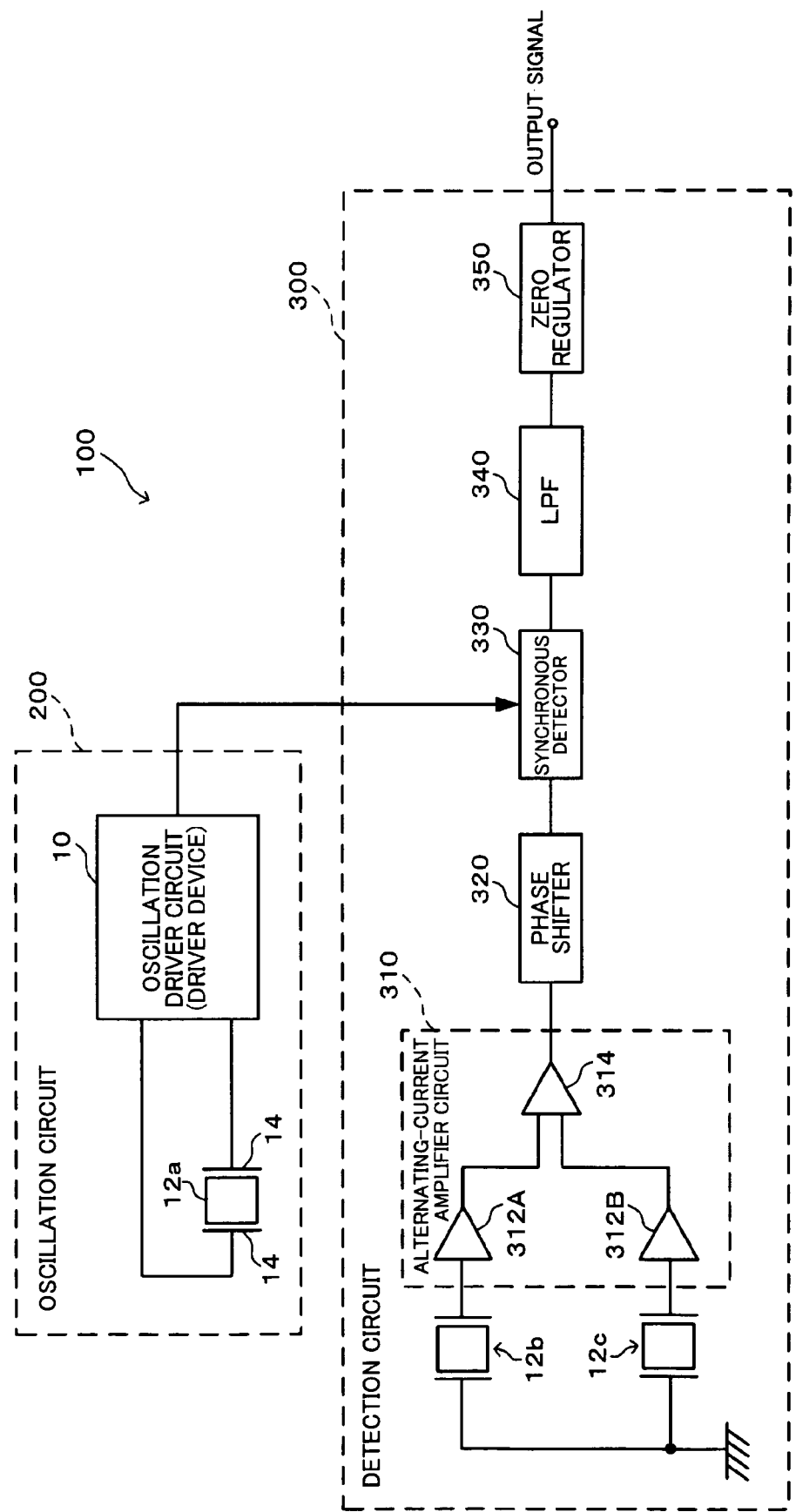
FIG. 7 is a block diagram showing a configuration example of a vibrating gyrosensor according to one embodiment of the invention.

FIG. 7 is a block diagram showing a configuration example of a vibrating gyrosensor to which the oscillation driver circuit 10 according to the above embodiment is applied.

In FIG. 7, the same sections as in FIG. 1 are indicated by the same symbols. Description of these sections is appropriately omitted.

A vibrating gyrosensor (physical quantity measuring device in a broad sense) 100 includes an oscillation circuit 200 and a detection circuit (detection device in a broad sense) 300. The oscillation circuit 200 includes the vibrator 12 and the oscillation driver circuit 10. The oscillation driver circuit 10 causes a driving vibration section 12a of the vibrator 12 to oscillate.

During oscillation startup, the output from the GCA 20 of which the gain has become larger than unity based on the control signal VCTL is input to the oscillation driver circuit 10 as noise. The noise is subjected to frequency selection while passing through the driving vibration section 12a of the vibrator 12. The signal which has passed through the driving vibration section 12a is partially removed, is input to the full-wave rectifier 42, and is converted into an amplitude. The signal having this amplitude is input to the oscillation detector 44 to generate the switch control signal SWCTL#. Since the amplitude of the signal subjected to frequency selection while passing through the vibrator 12a is small during the oscillation startup, the oscillation detector 44 generates the switch control signal SWCTL# set at the H level (or switch control signal SWCTL set at the L level).

The amplitude of the signal subjected to frequency selection while passing through the vibrator 12a increases immediately after oscillation startup, whereby the oscillation detector 44 generates the switch control signal SWCTL# set at the L level. This causes the oscillation loop to be switched so that the amplitude of the signal subjected to frequency selection while passing through the vibrator 12a is controlled by the GCA 20. When most of the noise is cut off by the driving vibration section 12a and the output from the full-wave rectifier 42 is relatively small, the gain of the GCA 20 is increased so that the loop gain of the oscillation loop becomes unity. Since the output from the full-wave rectifier 42 increases with the passage of time, the gain of the GCA 20 is reduced so that the loop gain becomes unity.

When the oscillation state of the drive signal has been stabilized, detection of signals from driving detection sections 12b and 12c of the vibrator 12 is started. Specifically, the detection signals (alternating-current) from the driving detection sections 12b and 12c of the vibrator are amplified using alternating-current amplifiers 312A and 312B of an alternating-current amplifier circuit 310, and the outputs from the amplifiers 312A and 312B are summed using an adder 314. The output from the adder 314 is caused to pass through a phase shifter 320 to obtain a phase-shifted signal. The phase of the phase shift signal differs from the phase of the synchronous detection clock signal which is the output from the synchronous detection comparator 50 of the oscillation driver circuit 10 by a specific angle such as 90°. The phase-shifted signal and the synchronous detection clock signal from the oscillation driver circuit 10 are input to a synchronous detector 330 to detect the output signal from the vibrator 12. As a result, unnecessary leakage signals are removed from the detected output signal or at least reduced. Since the phase can be adjusted according to a change in phase during the weak signal detection process by adjusting the phases of the synchronous detection clock signal and the detection signal using the detection circuit 300, a highly accurate phase adjustment can be achieved while preventing an increase in circuit scale.

The detected output signal is input to a low-pass filter 340, smoothed, and input to a zero regulator 350. The output from the zero regulator 350 is removed as an output signal corresponding to the physical quantity (e.g. angular velocity) to be measured.

The vibrating gyrosensor 100 shown in FIG. 7 is preferably provided in electronic instruments such as a video camera, a digital camera, a car navigation system, an aircraft, and a robot.

The invention is not limited to the vibrator 12 illustrated in this embodiment. As examples of the material for the vibrator 12, constant modulus alloys such as elinvar and ferroelectric single crystals (piezoelectric single crystals) can be given. As examples of such single crystals, a rock crystal, lithium niobate, lithium tantalate, a lithium niobate-lithium tantalate solid solution, lithium borate, and langasite can be given. It is preferable that the vibrator 12 be hermetically sealed in a package. It is preferable that the package be filled with dry nitrogen or be under vacuum.

The physical quantity measured according to the invention is not limited to an angular velocity illustrated in this embodiment. The invention aims at a physical quantity which can be detected from a change in vibration state using a detection circuit when the vibrator is caused to produce driving vibrations and the vibration state of the vibrator has changed due to the effects of the physical quantity on the vibrator producing driving vibrations. As such a physical quantity, acceleration and angular acceleration are particularly preferred in addition to the angular velocity applied to the vibrator. As the detection device, an inertial sensor is preferred.

Although only some embodiments of the invention have been described above in detail, those skilled in the art would readily appreciate that many modifications are possible in the embodiments without materially departing from the novel teachings and advantages of the invention. Accordingly, such modifications are intended to be included within the scope of the invention.

What is claimed is:

1. A driver device that forms an oscillation loop with a vibrator and causes the vibrator to produce driving vibrations, the driver device comprising:
   a current-voltage converter that is provided in the oscillation loop and converts a current that flows through the vibrator into a voltage; and
   a first comparator that is provided in the oscillation loop and outputs a signal corresponding to a comparison result between an output from the current-voltage converter and a given voltage,
   the first comparator outputting a first high-level voltage or a low-level voltage during oscillation startup, and outputting a second high-level voltage or the low-level voltage in a steady oscillation state; and
   the first high-level voltage being a voltage higher in potential than the second high-level voltage.

2. The driver device as defined in claim 1,
   the driver device including a second comparator that generates a reference signal based on a signal in the oscillation loop, the reference signal being used to synchronously detect a detection signal that is output from the vibrator based on the driving vibrations produced by the vibrator and a physical quantity to be measured.

3. The driver device as defined in claim 1,
   the driver device including an oscillation detector that detects a signal from the vibrator,
   the driver device switching a high-level voltage output from the first comparator from the first high-level voltage to the second high-level voltage based on a detection result of the oscillation detector.

4. The driver device as defined in claim 3,
   the driver device switching the high-level voltage output from the first comparator from the first high-level voltage to the second high-level voltage on condition that the oscillation detector has detected that a direct-current voltage obtained by converting the current that flows through the vibrator has reached a given threshold voltage.

5. The driver device as defined in claim 1,
   the first high-level voltage being a voltage that causes a gain in the oscillation loop to be larger than unity.

6. The driver device as defined in claim 1,
   the vibrator being a capacitive-coupling vibrator; and
   the first comparator causing the vibrator to produce the driving vibrations by applying a rectangular-wave drive signal to the vibrator.

7. A physical quantity measuring device that measures a physical quantity corresponding to a detection signal that is output from a vibrator based on driving vibrations produced by the vibrator and the physical quantity to be measured, the physical quantity measuring device comprising:
   the vibrator;
   the driver device as defined in claim 2 that causes the vibrator to produce the driving vibrations; and
   a detection device that detects an output signal corresponding to the physical quantity based on the detection signal,
   the detection device including a synchronous detector that synchronously detects the detection signal based on an output from the second comparator.

8. The physical quantity measuring device as defined in claim 7,
   the detection device including a phase shifter that adjusts phases of the output from the second comparator and the detection signal.

9. An electronic instrument comprising the physical quantity measuring device as defined in claim 8.

* * * * *